US008907656B2

(12) United States Patent
Chen

(10) Patent No.: US 8,907,656 B2
(45) Date of Patent: Dec. 9, 2014

(54) INTEGRATED CURRENT SENSING APPARATUS

(75) Inventor: Shih-Tsung Chen, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 325 days.

(21) Appl. No.: 13/452,942

(22) Filed: Apr. 23, 2012

(65) Prior Publication Data

US 2013/0200881 A1 Aug. 8, 2013

(30) Foreign Application Priority Data

Feb. 2, 2012 (TW) .............................. 101103326 A

(51) Int. Cl.
*G01R 15/20* (2006.01)
(52) U.S. Cl.
USPC ............ 324/117 R; 324/117 H; 324/127; 324/177; 324/348; 324/522; 324/754.26; 324/713
(58) Field of Classification Search
CPC . G01R 15/202; G01R 35/005; G01R 1/06788
USPC ............ 324/117 R, 117 H, 348, 522, 754.26, 324/713, 177, 127
See application file for complete search history.

(56) References Cited

U.S. PATENT DOCUMENTS

| 5,146,156 A | 9/1992 | Marcel |
| 5,477,135 A | 12/1995 | Baker |
| 6,351,116 B1 | 2/2002 | Bolda et al. |
| 2006/0219436 A1 | 10/2006 | Taylor et al. |

| 2007/0053127 A1 * | 3/2007 | Dobbs et al. ................. 361/93.1 |
| 2007/0279053 A1 | 12/2007 | Taylor et al. |
| 2011/0288799 A1 | 11/2011 | Cortes et al. |

FOREIGN PATENT DOCUMENTS

| EP | 0294636 A2 | 12/1988 |
| EP | 0294636 A2 | 12/1988 |

OTHER PUBLICATIONS

"ACS712, Rev.13-Fully Integrated, Hall Effect-Based Linear Current Sensor IC with 2.1 kVRMS Isolation and a Low-Resistance Current Conductor", Jan. 1, 2010, pp. 1-14, XP055039528, Retrieved from the Internet: URL:http://pdf1.alldatasheet.com/datasheet-pdf/view/428383/ALLEGRO/ACS712.html, retrieved on Sep. 28, 2012, figures 6,7.

* cited by examiner

*Primary Examiner* — Tung X Nguyen
*Assistant Examiner* — Son Le
(74) *Attorney, Agent, or Firm* — CKC & Partners Co., Ltd.

(57) ABSTRACT

An integrated current sensing apparatus includes a magnetic-field sensing element, a power supply circuit, an offset adjustment circuit, a gain adjustment circuit and a regulating unit. The magnetic-field sensing element is configured for sensing magnetic field, and correspondingly generating a sensing voltage. The power supply circuit is electrically coupled to the magnetic-field sensing element, for generating a constant current to the magnetic-field sensing element to control the sensing voltage. The offset adjustment circuit is electrically coupled to the magnetic-field sensing element, for adjusting an offset of the sensing voltage. The gain adjustment circuit is electrically coupled to the offset adjustment circuit, for amplifying the sensing voltage to a rated output voltage. The regulating unit is electrically coupled to the power supply circuit, the offset adjustment circuit and the gain adjustment circuit, for controlling the constant current, the offset and a gain value.

13 Claims, 5 Drawing Sheets

INTEGRATED CURRENT SENSING APPARATUS

RELATED APPLICATIONS

This application claims priority to Taiwan Application Serial Number 101103326, filed Feb. 2, 2012, which is herein incorporated by reference.

BACKGROUND

1. Field of Invention

The present invention relates to a current sensing apparatus. More particularly, the present invention relates to an integrated current sensing apparatus.

2. Description of Related Art

In recent years, most of current sensing circuits are implemented by using Hall elements. The Hall element with the characteristic that the sensing voltage of which is in proportion to the current of an object to be measured, can therefore be used to estimate the current of an object by the sensing voltage.

FIG. 1 is a circuit diagram of a current sensing apparatus 100 of prior art. The integrated current sensing apparatus 100 includes a power supply circuit, a Hall element U2, an offset adjustment circuit and a gain adjustment circuit. The power supply circuit provides a constant current to the Hall element U2 via a transistor Q1 to control a sensing voltage. The offset adjustment circuit adjusts an offset of the sensing voltage by changing a ratio between a resistance R9 and a resistance R10. After that, the gain adjustment circuit adjusts a gain value of the sensing voltage by changing the ratio between a resistance R8 and a resistance R7, to generate a rated output voltage, such as 0-5 V.

However, in the conventional current sensing circuit, the resistance values of the resistance R8, R9, R10 may be shifted causing by the instability and the unreliability of the cutting process, such that the ratios between the resistances may not be precise enough. In addition, the characteristic of the resistances may be different in varying temperature, and as a result that the ratios between the resistances may be shifted and the accuracy of current sensing may decline.

In view of foregoing, there is an urgent need in the related field to provide a solution.

SUMMARY

The following presents a simplified summary of the disclosure in order to provide a basic understanding to the reader. This summary is not an extensive overview of the disclosure and it does not identify key/critical elements of the present invention or delineate the scope of the present invention. Its sole purpose is to present some concepts disclosed herein in a simplified form as a prelude to the more detailed description that is presented later.

An aspect of the present invention is to provide an integrated current sensing apparatus with a regulating unit, in which the regulating unit can be configured by a user to adjust a constant current, an offset and a gain value of the integrated current sensing apparatus.

According to an embodiment of the present invention, the present invention provides the integrated current sensing apparatus, which includes a magnetic-field sensing element, a power supply circuit, an offset adjustment circuit, a gain adjustment circuit and a regulating unit. The magnetic-field sensing element is configured for sensing magnetic field, and correspondingly generating a sensing voltage. The power supply circuit is electrically coupled to the magnetic-field sensing element, for generating a constant current to the magnetic-field sensing element to control the sensing voltage. The offset adjustment circuit is electrically coupled to the magnetic-field sensing element, for adjusting the offset of the sensing voltage. The gain adjustment circuit is electrically coupled to the offset adjustment circuit, for amplifying the sensing voltage to a rated output voltage. The regulating unit is electrically coupled to the power supply circuit, the offset adjustment circuit and the gain adjustment circuit, for controlling the constant current, the offset and the gain value, in which the gain adjustment circuit utilizes the gain value for amplifying the sensing voltage.

According to another embodiment of the present invention, the regulating unit comprises an electrically-erasable programmable read-only memory.

According to another embodiment of the present invention, the regulating unit saves parameters individually corresponding to the constant current, the offset and the gain value.

According to another embodiment of the present invention, the regulating unit is electrically coupled to an external apparatus via an input/output interface, and the external apparatus is utilized to separately adjust the parameters individually corresponding to the constant current, the offset and the gain value.

According to another embodiment of the present invention, the integrated current sensing apparatus further includes a temperature compensation circuit, being electrically coupled to the regulating unit. The temperature compensation circuit is configured to compensate the parameters individually corresponding to the constant current and the offset when temperature is changed, such that the regulating unit, when temperature is changed, can control the power supply circuit and the offset adjustment circuit to adjust the constant current and the offset.

According to another embodiment of the present invention, the regulating unit is configured to generate a constant current adjusting signal to the power supply circuit for adjusting a magnitude of the constant current generated by the power supply circuit.

According to another embodiment of the present invention, the regulating unit is configured to generate a gain adjusting signal to the gain adjustment circuit for adjusting the gain value, and the gain adjustment circuit amplifies the sensing voltage to the rated output voltage by the gain value.

According to another embodiment of the present invention, the regulating unit is configured to generate an offset adjusting signal to the gain adjustment circuit for adjusting the offset of the rated output voltage.

Another aspect of the present invention provides another integrated current sensing apparatus which includes a magnetic-field sensing element, a power supply circuit, a gain adjustment circuit, an offset adjustment circuit and a regulating unit. The magnetic-field sensing element is configured for sensing magnetic field and correspondingly generating a sensing voltage. The power supply circuit is electrically coupled to the magnetic-field sensing element, for generating a constant current to the magnetic-field sensing element to control the sensing voltage. The gain adjustment circuit being electrically coupled to the magnetic-field sensing element, for amplifying the sensing voltage to a rated output voltage. The offset adjustment circuit being electrically coupled to the gain adjustment circuit for adjusting an offset of the rated output voltage. The regulating unit being electrically coupled to and controlling the power supply circuit, the gain adjustment circuit and the offset adjustment circuit.

According to another embodiment of the present invention, the regulating unit is electrically coupled to an external apparatus by an input/output interface, and the external apparatus is utilized to separately adjust the parameters individually corresponding to the constant current, the gain value and the offset.

According to another embodiment of the present invention, the integrated current sensing apparatus further includes a temperature compensation circuit, being electrically coupled to the regulating unit. The temperature compensation circuit is configured to compensate the parameters individually corresponding to the constant current, the offset and the gain value when temperature is changed, such that the regulating unit respectively outputs, when temperature is changed, a constant current adjusting signal and an offset adjusting signal to the power supply circuit and the offset adjustment circuit.

According to another embodiment of the present invention, the regulating unit is configured to generate a constant current adjusting signal to the power supply circuit for adjusting the value of the constant current generated by the power supply circuit.

According to another embodiment of the present invention, the regulating unit is configured to generate a gain adjusting signal to the gain adjustment circuit for adjusting a gain value, and the gain adjustment circuit amplifies the sensing voltage to the rated output voltage by the gain value.

According to another embodiment of the present invention, the regulating unit is configured to generate an offset adjusting signal to the gain adjustment circuit for adjusting the offset of the rated output voltage.

According to another embodiment of the present invention, the regulating unit saves parameters individually corresponding to the constant current, the offset and the gain value, and controls the power supply circuit the gain adjustment circuit and the offset adjustment circuit according to the parameters.

Therefore, by implementing the embodiments of the present disclosure, the disadvantages and shortcomings of the conventional technologies can be eliminated.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
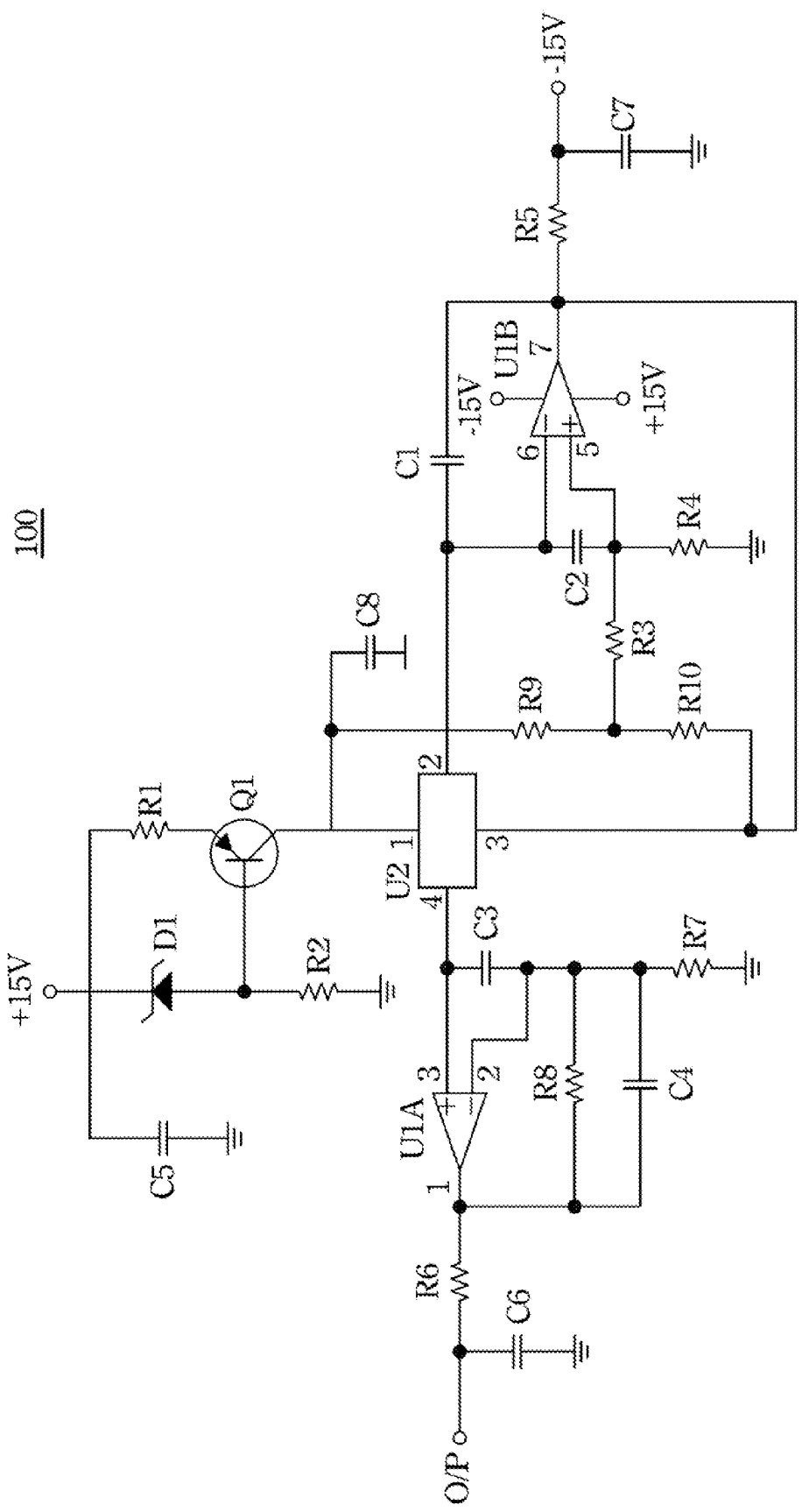
FIG. 1 is a circuit diagram of a current sensing apparatus 100 of prior art.

In the following detailed description, for purposes of explanation, numerous specific details are set forth in order to attain a thorough understanding of the disclosed embodiments. It will be apparent, however, that one or more embodiments may be practiced without these specific details. In other instances, well-known structures and apparatuses are schematically shown in order to simplify the drawing.

Figure 2:
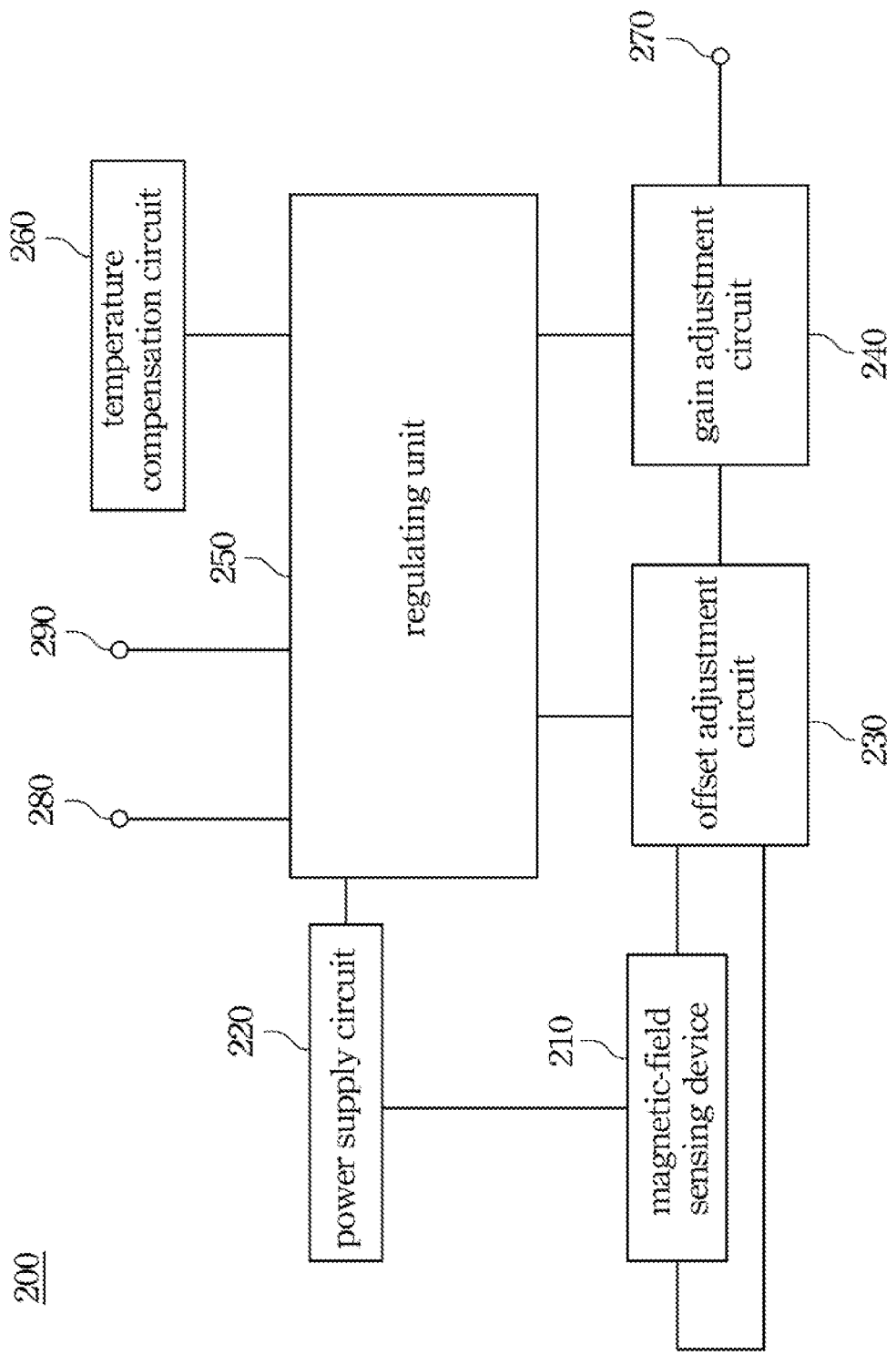
FIG. 2 is a block diagram of an integrated current sensing apparatus according to a first embodiment of the present invention.

FIG. 2 is a block diagram of an integrated current sensing apparatus 200 according to a first embodiment of the present invention. The integrated current sensing apparatus 200 includes a magnetic-field sensing element 210, a power supply circuit 220, an offset adjustment circuit 230, a gain adjustment circuit 240 and a regulating unit 250.

The magnetic-field sensing element 210 is configured for sensing the magnetic field generated by the current of an object to be measured, and correspondingly generates a sensing voltage. The power supply circuit 220 is electrically coupled to the magnetic-field sensing element 210 for generating a constant current to the magnetic-field sensing element 210 so as to control the sensing voltage. The offset adjustment circuit 230 is electrically coupled to the magnetic-field sensing element 210, for adjusting an offset of the sensing voltage. The gain adjustment circuit 240 is electrically coupled to the offset adjustment circuit 230, for amplifying the sensing voltage to a rated output voltage by changing the gain value, in which the rated output voltage may be 0-5 V.

The regulating unit 250 is electrically coupled to the power supply circuit 220, the offset adjustment circuit 230 and the gain adjustment circuit 240, for controlling the circuits 220, 230, 240, so as to control the constant current generated by the power supply circuit 220, the offset adjusted by the offset adjustment circuit 230 and the gain value respectively, in which the gain value is used by the gain adjustment circuit 230 for amplifying the sensing voltage.

In this embodiment of present invention, the regulating unit 250 generates a constant current adjusting signal, an offset adjusting signal and a plurality of gain adjusting signals, in which the signals above are respectively corresponding to the power supply circuit 220, the offset adjustment circuit 230 and the gain adjustment circuit 240. When the constant current adjusting signal, the offset adjusting signal and a plurality of gain adjusting signals are adjusted, the constant current, the offset and the gain value would correspondingly be changed. The controlling manner of this regard will be described in detail in the embodiments below.

Figure 3:
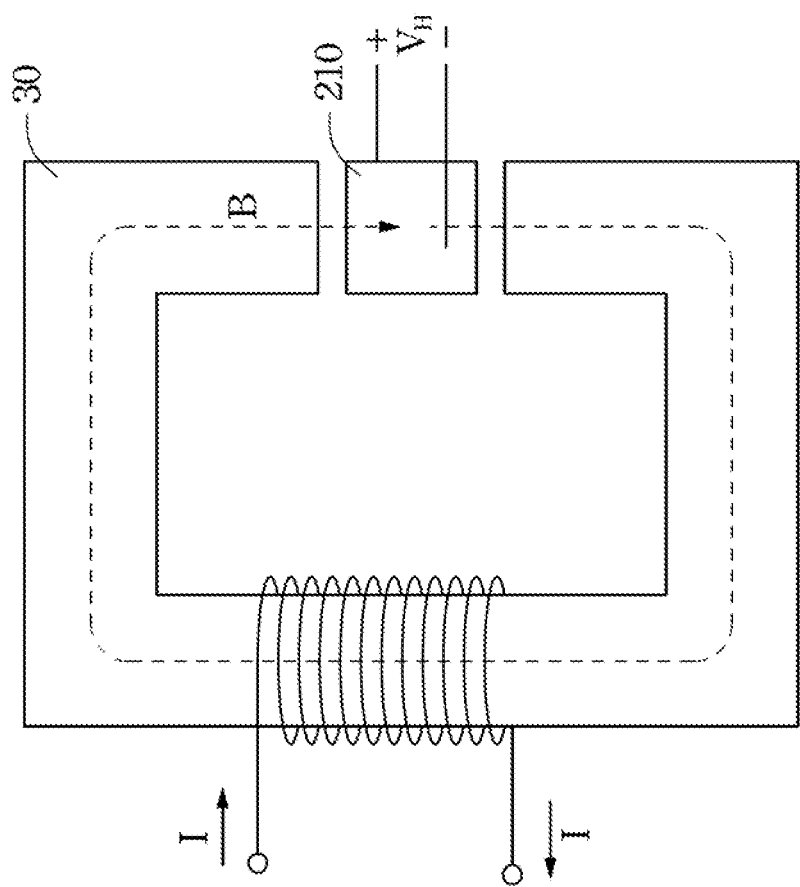
FIG. 3 is a perspective view of an integrated current sensing apparatus according to the present invention.

FIG. 3 is a perspective view of the magnetic-field sensing element 210 of the integrated current sensing apparatus 200 according to the first embodiment of present invention. The magnetic-field sensing element 210 is a Hall element being disposed adjacent to an object 30, such as an iron core, for sensing a magnetic-field generated by a current I flowing through the object 30. For example, the object 30 is wounded by a coil of wire, and the magnetic-field sensing element 210 is disposed adjacent to the object 30 for sensing the magnetic-field generated by a current flowing through the wire. When the current I flows on the wire and pass through the inner diameter of the object 30, a magnetic flux B is generated within the object 30 and is in proportion to the current I. When the plane of the magnetic sensing element 210 and the direction of the magnetic flux B are perpendicular, a sensing voltage is generated on the magnetic sensing element 210 according to the magnetic flux B. That is, by utilizing the characteristic equation of the Hall effect $V_H = K * R_d * I_C * B * \sin\theta$, the sensing voltage $V_H$, i.e., Hall voltage, can be acquired with the fact that the parameters K, $R_d$, $I_C$, and $\sin\theta$ are all constants. Hence, the sensing voltage generated on the magnetic sensing element 210 is in proportion to the magnetic flux B in the characteristic equation above, and as a result, the magnitude of the magnetic flux B on the object 30 generated by the current I can be estimated by measuring the sensing voltage on the magnetic sensing element 210.

Figure 4:
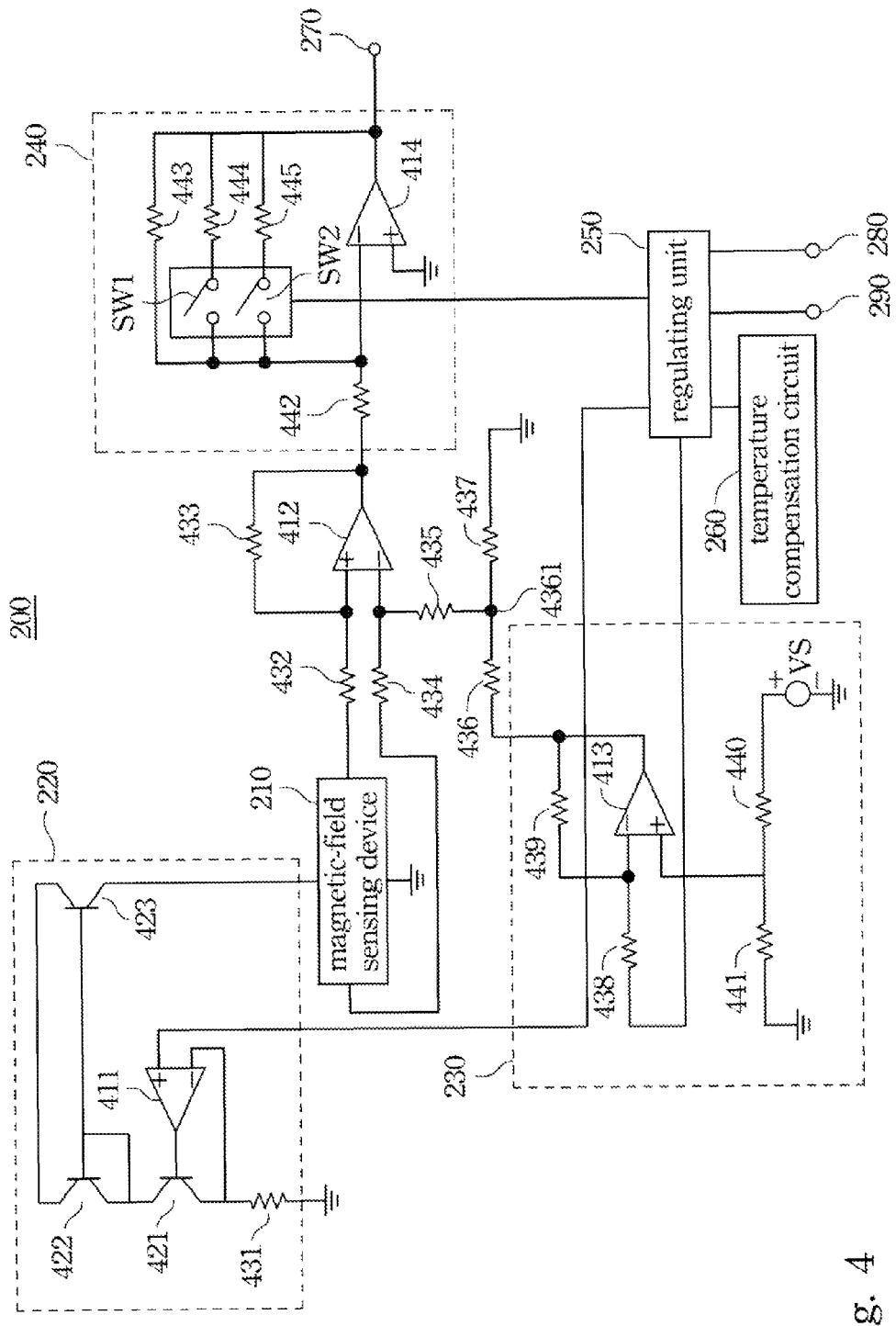
FIG. 4 is a circuit diagram of the integrated current sensing apparatus shown in FIG. 2, in which some elements of the circuit are shown in block diagram form therewithin.

FIG. 4 is a circuit diagram of the integrated current sensing apparatus shown in FIG. 2, in which some elements of the circuit are shown in block diagram form therewithin. In this embodiment of the present invention, the power supply circuit 220 includes current mirror composed of an operational amplifier 411, a transistor 421, a transistor 422, a transistor 423 and a resistance 431. The regulating unit 250 is configured for generating the constant current adjusting signal, such as a voltage signal, to a positive input port of the operational amplifier 411, and in the end to control the transistor 423 providing the magnetic-field sensing element 210 with the constant current. According to the characteristic equation of the Hall effect $V_H=K*R_d*I_C*B*\sin\theta$, the constant current $I_C$ is related to the sensing voltage $V_H$ generated by the magnetic-field sensing element 210, so that the magnitude of the constant current may change the sensing voltage generated by the magnetic-field sensing element 210.

In one embodiment of the present invention, there is a condition that the current I flows through the object 30 is 0 A, and the sensing voltage generated by the magnetic-field sensing element 210 may not be zero. In this condition, the regulating unit 250 can output the offset adjusting signal, such as a voltage signal, to a negative port of the operational amplifier 413 for adjusting the voltage of a node 4361 and in the end changing the offset of the sensing voltage generated by the magnetic-field sensing element 210. By such a manner, when the current I flows through the object 30 is 0 A, a rated output voltage generated by the integrated current sensing apparatus 200 on a node 270 can be revised to 0 V, The sensing voltage can be transmitted to the gain adjustment circuit 240 by a unit gain buffer which composed of an operational amplifier 412, a resistance 432, a resistance 433, a resistance 434 and a resistance 435. The regulating unit 250 can generate a plurality of gain adjusting signals, such as voltage signals, to respectively control actions of a switch SW1 and a switch SW2 for adjusting a gain value of an operational amplifier 414 flexibility, such that the sensing voltage can be amplified to the rated output voltage, such as 0-5 V. In this embodiment of the present invention, the switch SW1 and SW2 may be digital switches, but they can be replaced by other equivalent circuits in embodiments of the present invention, and the type and the quantity of switches are not limited to the embodiment above.

For example, when the current I flow through the object 30 is 0 A, the sensing voltage can be revised by the offset, such that the rated output voltage of the integrated current sensing apparatus 200 is 0 V. When the current I is 3.75 A, 7.5 A, 11.25 A or 15 A, because the sensing voltage is in proportion to the current I, such that after adjusting the gain value, the rated output voltage of the integrated current sensing apparatus 200 may respectively be 1 V, 2 V, 3 V and 4 V. Similarly, when the current is −3.75 A, −7.5 A, −11.25 A or −15 A, because the sensing voltage is in proportion to the current I, such that after adjusting the gain value, the rated output voltage of the integrated current sensing apparatus 200 may respectively be 1 V, 2 V, 3 V and 4 V.

It is noted that, in this embodiment of the present invention, the regulating unit 250 may includes an electrically erasable programmable read only memory, so that the regulating unit 250 can save the parameters for adjusting the constant current, the offset and the gain value. Therefore, by adjusting the parameters save in the regulating unit 250, the constant current adjusting signal, the offset adjusting signal and the gain adjusting signal outputted by the regulating unit 250 can correspondingly be adjusted. That is, the regulating unit 250 can control the power supply circuit 220, the offset adjustment circuit 230 and the gain adjustment circuit 240 according to the parameters above. Moreover, in this embodiment, the regulating unit 250 can be electrically coupled to an external apparatus, such as a computer, via an input/output interface 280 or 290, and by utilizing the external apparatus to adjust the parameters saved in the regulating unit 250 individually corresponding to the constant current, the offset and the gain value, to change the constant current, the offset and the gain value of the integrated current sensing apparatus 200.

In the first embodiment of the present invention, the integrated current sensing apparatus 200 further includes a temperature compensation circuit 260 being electrically coupled to the regulating unit 250. The temperature compensation circuit 260 is configured to compensate the parameters individually corresponding to the constant current and the offset when temperature is changed, and further to change the constant adjusting signal and the offset adjusting signal outputted by the regulating unit 250. In such a manner, the regulating unit 250 can steadily and suitably output constant current adjusting signal and offset adjusting signal to the power supply circuit 220 and the offset adjustment circuit 230 respectively when temperature change.

Figure 5:
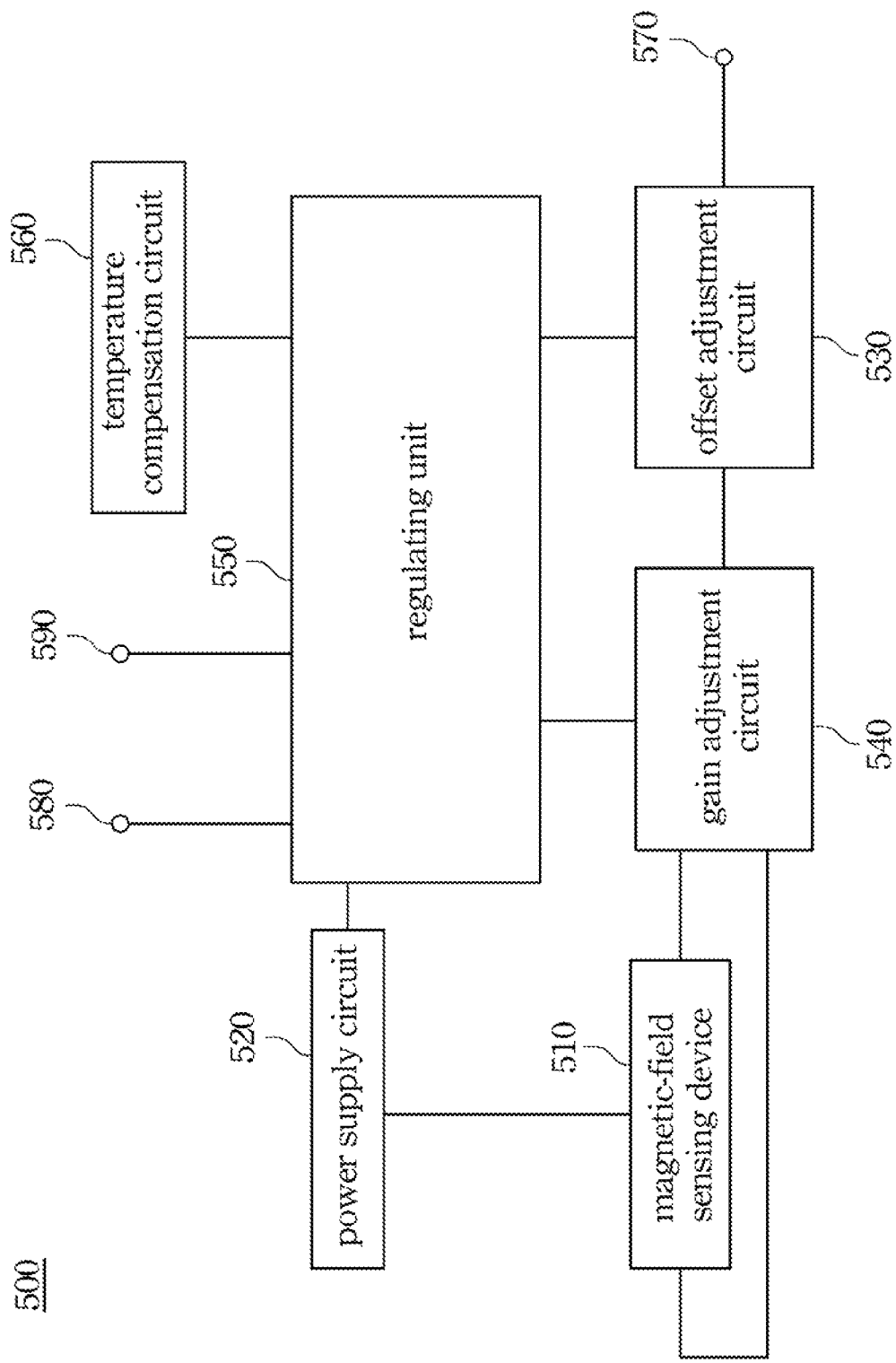
FIG. 5 is a block diagram of an integrated current sensing apparatus according to a second embodiment of the present invention.

FIG. 5 is a block diagram of an integrated current sensing apparatus 500 according to a second embodiment of the present invention. The integrated current sensing apparatus 500 includes a magnetic-field sensing element 510, a power supply circuit 520, a gain adjustment circuit 540, an offset adjustment circuit 530, and a regulating unit 550.

The magnetic-field sensing element 510 is configured for sensing the magnetic field generated by the current of an object to be measured, and correspondingly generates a sensing voltage. The power supply circuit 520 is electrically coupled to the magnetic-field sensing element 510 for generating a constant current to the magnetic-field sensing element 510 so as to control the sensing voltage. The gain adjustment circuit 540 is electrically coupled to the magnetic-field sensing element 510, for amplifying the sensing voltage to a rated output voltage, such as 0-5 V. The offset adjustment circuit 530 is electrically coupled to the gain adjustment circuit 540, for adjusting an offset of the rated output voltage. The regulating unit 550 is electrically coupled to the power supply circuit 520, the offset adjustment circuit 530 and the gain adjustment circuit 540, for controlling these circuits 520, 530, 540, so as to control the constant current, the offset and the gain value used by the gain adjustment circuit 530 for amplifying the sensing voltage.

In this embodiment of present invention, the magnetic-field sensing element 510 may be a Hall element being configured to sensing the magnetic-field generated by a current flowing through an object to be measured. Similarly, if the object is wounded by a coil of wire, and the magnetic-field sensing element 510 is disposed adjacent to the object, the magnetic-field sensing element 510 would sense the magnetic-field generated by the current on the wire, in which the disposition of the magnetic-field sensing element 510 and the object to be measured are similar to or as same as the disposition of which shown in FIG. 3. Similarly, when the current flows through the object or the wire wounded on the object, a magnetic flux is generated within the object and is in proportion to the current I. When the plane of the magnetic sensing element 510 and the direction of the magnetic flux B are perpendicular, a sensing voltage is generated on the magnetic sensing element 510 according to the magnetic flux B. That is, by utilizing the characteristic equation of the Hall effect $V_H=K*R_d*I_C*B*\sin\theta$, the Hall voltage can be acquired with the fact that the parameters K, $R_d$, $I_C$, and $\sin\theta$ are all constants. Hence, the magnitude of the magnetic flux B within the object 30 generated by the current I can be estimated by measuring the sensing voltage on the magnetic sensing element 510.

In this embodiment, the regulating unit 550 may generate a constant current adjusting signal, such as a voltage signal, to the power supply circuit 520 for adjusting the constant current which provided by the power supply circuit 520 to the magnetic sensing element 510, in which the constant current may change the sensing voltage generated by the magnetic sensing element 510. In addition, the regulating unit 550 may generate a gain adjusting signal, such as a voltage signal, to the gain adjustment circuit 540 for adjusting the gain value, in which the gain value is used by the gain adjustment circuit 540 for amplifying the sensing voltage to the rated output voltage, such as 0-5 V.

In one embodiment of the present invention, there is a condition that the current I flows through the object to be measured is 0 A, and the sensing voltage generated by the magnetic-field sensing element 510 may not be zero, such that the rated output voltage may also not be zero. In this condition, the regulating unit 250 can output the offset adjusting signal, such as a voltage signal, to the offset adjustment circuit for adjusting the offset of the rated output voltage, such that when the current I flows through the object to be measured is 0 A, the rated output voltage can be revised to 0 V.

In this embodiment of the present invention, the regulating unit 250 may includes an electrically erasable programmable read only memory, so that the regulating unit 250 can save the parameters for adjusting the constant current, the offset and the gain value. Therefore, by adjusting the parameters above can correspondingly adjust the constant current adjusting signal, the offset adjusting signal and the gain adjusting signal outputted by the regulating unit 550. Furthermore, the regulating unit 550 can be electrically coupled to an external apparatus, such as a computer, via an input/output interface 580 or 590, and by utilizing the external apparatus to adjust the parameters in the regulating unit 550 individually corresponding to the constant current, the offset and the gain value, and further to change the constant current, the offset and the gain value of the integrated current sensing apparatus 500.

Moreover, the integrated current sensing apparatus 500 further includes a temperature compensation circuit 560 being electrically coupled to the regulating unit 550. The temperature compensation circuit 560 is configured to compensate the parameters in the regulating unit 550 individually corresponding to the constant current and the offset when temperature is changed, such that the regulating unit 550 can still steadily output constant current adjusting signal and offset adjusting signal to the power supply circuit 520 and the offset adjustment circuit 530 when temperature is changed.

In this embodiment of the present invention the power supply circuit 520, the offset adjustment circuit 530 and the gain adjustment circuit 540 can be implemented with the circuits shown in FIG. 4. In addition, the operating that the constant current adjusting signal, the offset adjusting signal and the gain adjusting signal are outputted by the regulating unit 550 respectively to the power supply circuit 520, the offset adjustment circuit 530 and the gain adjustment circuit 540 can be similar to or as same as which in the embodiment shown in FIG. 4. It is noted that the structure and the operating in this regard are not limited to those in the embodiment shown in FIG. 4.

In contrast to the conventional art, the embodiments of the present invention above utilize the regulating unit to adjust the constant current outputted by the power supply circuit, the offset of the offset adjustment circuit and the gain value of the gain adjustment circuit. In this manner, the accuracy problem in a result of a cutting process of the resistances in the circuits can be avoided, and the inaccuracy of the current estimation causing by the shifting of the ratios between certain resistances can also be avoided. Moreover, the integrated current sensing apparatus in the embodiments of the present invention can be realized by an integrated circuit, so that the accuracy of each component and circuit can be promoted remarkably and the current estimation can be more precise.

It is noted that, of the steps mentioned in the embodiments above, except for some steps the sequence of which has already been clearly pointed out in the description above, the sequence of the steps can be adjusted in accordance with various requirements, or these steps can also be but not limited to run simultaneously or partially simultaneously.

It will be apparent to those ordinarily skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. An integrated current sensing apparatus comprising:
    a magnetic-field sensing element for sensing magnetic field and correspondingly generating a sensing voltage;
    a power supply circuit electrically coupled to the magnetic-field sensing element, for generating a constant current to the magnetic-field sensing element to control the sensing voltage;
    an offset adjustment circuit electrically coupled to the magnetic-field sensing element for adjusting an offset of the sensing voltage;
    a gain adjustment circuit electrically coupled to the offset adjustment circuit, for amplifying the sensing voltage to a rated output voltage;
    a regulating unit electrically coupled to the power supply circuit, the offset adjustment circuit and the gain adjustment circuit, for controlling the constant current, the offset and a gain value required by the gain adjustment circuit for amplifying the sensing voltage; and
    a temperature compensation circuit, being electrically coupled to the regulating unit, for compensating parameters individually corresponding to the constant current and the offset when temperature is changed, such that the regulating unit, when the temperature is changed, can control the power supply circuit and the offset adjustment circuit to adjust the constant current and the offset.

2. The integrated current sensing apparatus of claim 1, wherein the regulating unit comprises an electrically-erasable programmable read-only memory.

3. The integrated current sensing apparatus of claim 1, wherein the regulating unit saves parameters individually corresponding to the constant current, the offset and the gain value.

4. The integrated current sensing apparatus of claim 1, wherein the regulating unit is electrically coupled to an external apparatus via an input/output interface, and the external apparatus is utilized to separately adjust parameters individually corresponding to the constant current, the offset and the gain value.

5. The integrated current sensing apparatus of claim 1, wherein the regulating unit is configured to generate a constant current adjusting signal to the power supply circuit for adjusting a magnitude of the constant current generated by the power supply circuit.

6. The integrated current sensing apparatus of claim 1, wherein the regulating unit is configured to generate a gain adjusting signal to the gain adjustment circuit for adjusting the gain value, and the gain adjustment circuit amplifies the sensing voltage to the rated output voltage by the gain value.

7. The integrated current sensing apparatus of claim 1, wherein the regulating unit is configured to generate an offset adjusting signal to the gain adjustment circuit for adjusting the offset of the rated output voltage.

8. An integrated current sensing apparatus comprising:
   a magnetic-field sensing element for sensing magnetic field and correspondingly generating a sensing voltage;
   a power supply circuit electrically coupled to the magnetic-field sensing element, for generating a constant current to the magnetic-field sensing element to control the sensing voltage;
   a gain adjustment circuit electrically coupled to the magnetic-field sensing element, for amplifying the sensing voltage to a rated output voltage;
   an offset adjustment circuit electrically coupled to the gain adjustment circuit for adjusting an offset of the rated output voltage;
   a regulating unit electrically coupled to and controlling the power supply circuit, the gain adjustment circuit and the offset adjustment circuit; and
   a temperature compensation circuit, being electrically coupled to the regulating unit, for compensating parameters individually corresponding to the constant current, the offset and the gain value when temperature is changed, such that the regulating unit outputs a constant current adjusting signal and an offset adjusting signal to the power supply circuit and the offset adjustment circuit respectively when the temperature is changed.

9. The integrated current sensing apparatus of claim 8, wherein the regulating unit is electrically coupled to an external apparatus by an input/output interface, and the external apparatus is utilized to separately adjust parameters individually corresponding to the constant current, the gain value and the offset.

10. The integrated current sensing apparatus of claim 8, wherein the regulating unit is configured to generate a constant current adjusting signal to the power supply circuit for adjusting the value of the constant current generated by the power supply circuit.

11. The integrated current sensing apparatus of claim 8, wherein the regulating unit is configured to generate a gain adjusting signal to the gain adjustment circuit for adjusting a gain value, and the gain adjustment circuit amplifies the sensing voltage to the rated output voltage by the gain value.

12. The integrated current sensing apparatus of claim 8 wherein the regulating unit is configured to generate an offset adjusting signal to the gain adjustment circuit for adjusting the offset of the rated output voltage.

13. The integrated current sensing apparatus of claim 8, wherein the regulating unit saves parameters individually corresponding to the constant current, the offset and the gain value, and controls the power supply circuit the gain adjustment circuit and the offset adjustment circuit according to the parameters.

* * * * *